United States Patent [19]

Harada et al.

[11] Patent Number: 4,523,544
[45] Date of Patent: Jun. 18, 1985

[54] APPARATUS FOR GLOW DISCHARGE DEPOSITION OF A THIN FILM

[75] Inventors: Nozomu Harada, Yokohama; Hiroshi Ito, Tokyo; Toshikazu Adachi, Yokohama, all of Japan

[73] Assignee: Tokyo Shibaura Denki Kabushiki Kaisha, Kawasaki, Japan

[21] Appl. No.: 586,450

[22] Filed: Mar. 5, 1984

[30] Foreign Application Priority Data

Mar. 10, 1983 [JP] Japan .................................. 58-39545

[51] Int. Cl.$^3$ .......................................... C23C 13/08
[52] U.S. Cl. .................................. 118/702; 118/719; 118/723; 118/50.1; 118/704; 118/697; 427/39
[58] Field of Search ............... 118/719, 696, 723, 704, 118/50.1, 702, 697, 698; 427/39

[56] References Cited

U.S. PATENT DOCUMENTS

| | | | |
|---|---|---|---|
| 3,108,900 | 10/1963 | Papp | 118/723 X |
| 4,389,970 | 6/1983 | Edgerton | 118/723 X |
| 4,404,076 | 9/1983 | Nakagawa et al. | 427/39 |
| 4,430,959 | 2/1984 | Ebata et al. | 118/697 |
| 4,438,188 | 3/1984 | Shimatani et al. | 427/39 X |
| 4,452,828 | 6/1984 | Namba | 427/39 |

FOREIGN PATENT DOCUMENTS 57-64922  4/1982  Japan .

Primary Examiner—John D. Smith
Assistant Examiner—Bernard F. Plantz
Attorney, Agent, or Firm—Oblon, Fisher, Spivak, McClelland & Maier

[57] ABSTRACT

A thin amorphous film-forming apparatus comprising a plurality of discharge unit chambers connected in a loop, each provided with a glow discharge generating means and a space for storing a substrate, gas supply and discharge valves are provided between the unit chambers, and means for periodically changing the opening and closing of the valves.

6 Claims, 13 Drawing Figures

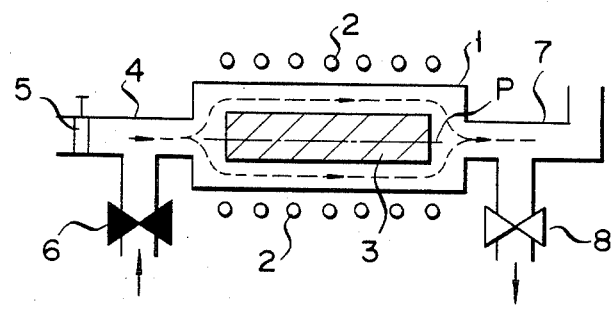
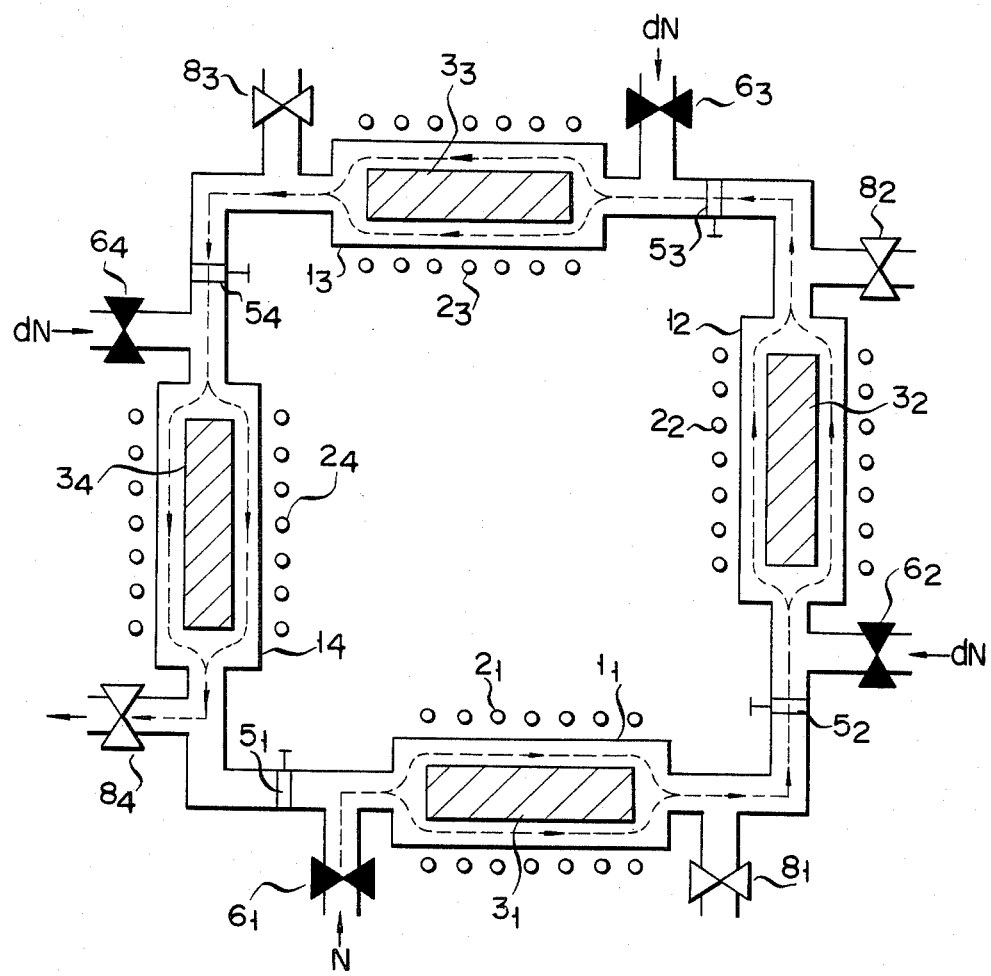

F I G. 6
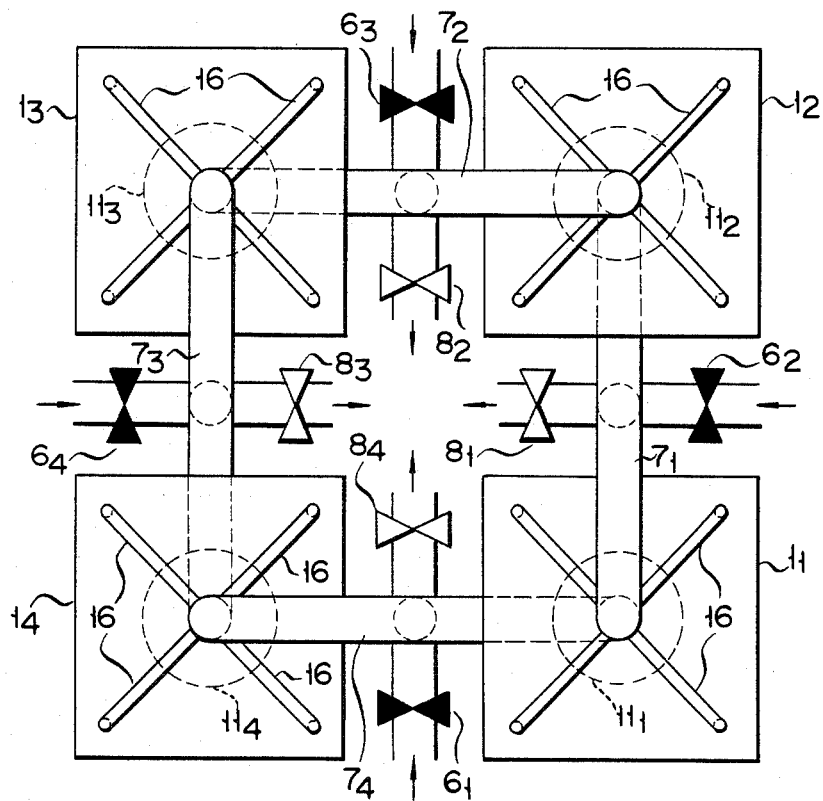
F I G. 7
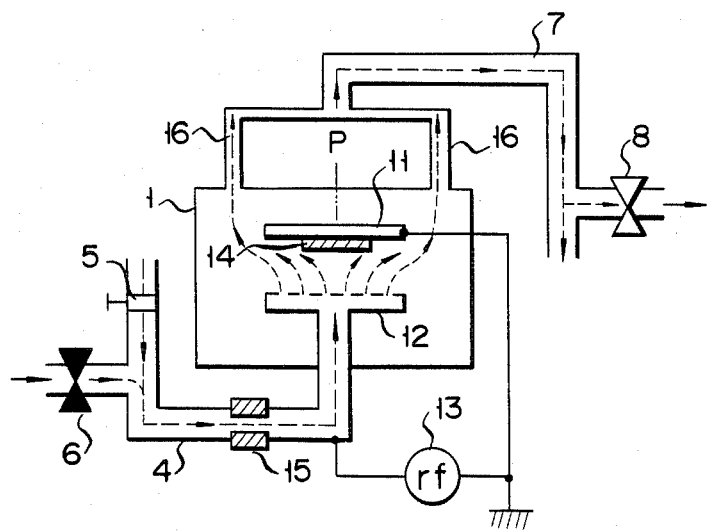

APPARATUS FOR GLOW DISCHARGE DEPOSITION OF A THIN FILM

BACKGROUND OF THE INVENTION a. Field of the Invention

The present invention relates to a thin film forming apparatus.

b. Description of the Prior Art

Recently, amorphous silicon (to be referred to as a-Si hereinafter) has been used as a material for a solar cell and a thin film transistor. Since a-Si has a photoconductive property, a variety of applications are being considered such as in a photosensitive film to replace an Se film and in a photoconductive element in a one or two-dimensional image sensor.

A thin film forming apparatus using glow discharge is known as a typical apparatus for forming a thin film such as an a-Si film. This apparatus is operated such that a compound gas is supplied to and discharged from a discharge chamber housing a substrate therein, and the compound gas is decomposed by glow discharge to deposit a thin a-Si film on the substrate. A compound for forming the a-Si film is represented by the general formula $SiH_xX_{4-x}$ (wherein X is F or Cl, and x is an integer from 0 to 4). For example, a compound such as $SiH_4$, $SiF_4$, $SiHF_3$, $SiH_3Cl_3$, $SiH_2Cl_2$ and $Si_2H_6$ or a mixture thereof is used for this purpose. The compound described above is generally held in a gas phase and can be used alone or diluted with an inert gas (e.g., Ar, He or Xe) or a gas (e.g., $H_2$). The thin film forming apparatus utilizing glow discharge is presently considered most effective as a means of forming a thin a-Si film.

However, the following problem is presented by an apparatus of this type. In deposition of the thin a-Si film, only a small proportion (%) of Si atoms contained in the compound gas is used for deposition of the thin a-Si film on the substrate. For this reason, a large amount of the compound gas is required to obtain a thin amorphous film having a desired thickness, resulting in high cost. In particular, when a relatively thick film having a thickness of 3 to 10 μm is formed for a two-story two-dimensional image sensor, the utilization efficiency of the compound gas is degraded, resulting in a crucial problem.

In order to solve the above problem, a thin amorphous film forming apparatus has been recently proposed in Japanese Patent Disclosure No. 57-64922, wherein a plurality of discharge chambers are connected in tandem with each other, and a compound gas flows from the first discharge chamber to the second and subsequent discharge chambers. According to this apparatus, the compound gas used in the preceding chambers is reused in the subsequent chambers thereof, thereby improving the utilization efficiency of the compound gas. However, the amount of gas and its activated state in each discharge chamber vary, so the properties of films formed in the respective discharge chambers vary. As a result, it is difficult to uniformly prepare devices having thin amorphous films of uniform equality.

SUMMARY OF THE INVENTION

It is an object of the present invention to provide a thin amorphous film forming method and an apparatus therefor, wherein the utilization efficiency of a compound gas can be improved, thin amorphous films of uniform quality can be simultaneously formed on a plurality of substrates, and uniform devices can be manufactured on a mass production line at a low cost.

It is another object of the present invention to provide a method of forming a considerably thick amorphous Si film and an apparatus therefor.

According to an aspect of the present invention, there is provided a method of forming a thin film on a sample by decomposing a compound gas containing a thin film component, comprising the steps of: providing a plurality of discharge unit chambers which have glow discharge generating means and spaces for storing the substrates and which are connected in a loop via connecting portions on which are mounted sets of gas supply valves and gas discharge valves; supplying the compound gas from at least one of said gas supply valves to sequentially flow the compound gas through said discharge unit chambers; discharging the compound gas from at least one of the discharge valves located furthest downstream; and sequentially switching a gas supply position and a gas discharge position along one direction of the loop every time a predetermined period of time has elapsed, thus forming thin films of multilayers on the substrates in said discharge unit chambers.

According to another aspect of the present invention, there is provided an apparatus for forming a thin film on a substrate by decomposing a compound gas, containing a target thin film component, by means of a glow discharge, comprising: a main body having a plurality of discharge unit chambers, each provided with glow discharge generating means and a space for housing the substrates and connected in a loop via chamber-connecting portions; sets of gas supply valves and supply discharge valves being connected to the chamber-connecting portions; and means for sequentially switching on and off said gas supply valves and said gas discharge valves along one direction of the loop every time a predetermined period of time has elapsed.

According to the present invention, the compound gas used for forming a thin film in a given unit chamber is reused in the next unit chamber, thereby improving the utilization efficiency of the gas. The properties of the thin film layers, formed in the respective unit chambers at a given time, differ from each other. However, since the gas supply position and the gas discharge position change along one direction of the loop every time the short period of time has elapsed, the thin films formed in the respective unit chambers finally become uniform. In this manner, uniform devices can be effectively manufactured on a mass production line while the amount of compound gas used can be reduced.

BRIEF DESCRIPTION OF THE DRAWINGS

FIG. 1 is a schematic view showing a unit chamber of a thin film forming apparatus according to a first embodiment of the present invention;

FIG. 2 is a schematic view showing the apparatus of the first embodiment, which is obtained by connecting in a loop unit chambers of the type shown in FIG. 1;

FIG. 6 is a schematic view showing a thin film forming apparatus according to a third embodiment of the present invention;

FIG. 7 is a side sectional view of a unit chamber of the apparatus shown in FIG. 6;

DETAILED DESCRIPTION OF THE PREFERRED EMBODIMENTS

Figure 3A:
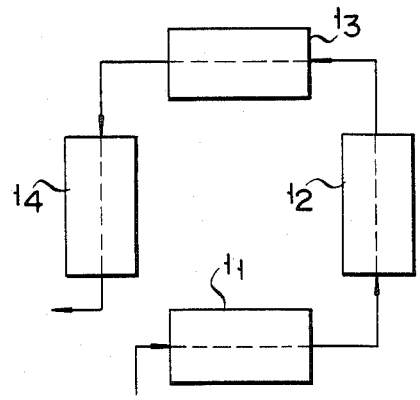
FIGS. 3(A) to 3(D) are representations showing sequences of gas supply/discharge switching in the apparatus of the first embodiment.

The preferred embodiment of the present invention will be described with reference to the accompanying drawings.

FIG. 1 is a schematic view showing a unit chamber of a thin film forming apparatus according to a first embodiment of the present invention. Referring to FIG. 1, reference numeral 1 denotes a discharge chamber with right and left openings. An induction coil 2 is wound around the discharge chamber 1 to generate a glow discharge therein. A photosensitive drum 3 is mounted as a substrate in the discharge chamber 1. The photosensitive drum 3 can be rotated about its axis P. A gas supply pipe 4 is connected to one open end of the discharge chamber 1. A stop valve 5 is mounted in the gas supply pipe 4 to open/close the pipe 4. A gas supply valve 6 is mounted between the stop valve 5 and the discharge chamber 1 to supply a compound gas. A gas discharge pipe 7 is connected to the other open end of the discharge chamber 1. The compound gas (e.g., a mixture of $SiH_4$, $H_2$, $O_2$ or the like for amorphous silicon) containing a thin film component is supplied to the discharge chamber 1 to be decomposed by a glow discharge, thereby depositing a thin a-Si film on the surface of the photosensitive drum 3.

As shown in FIG. 2, the thin film forming apparatus of the first embodiment is obtained by connecting in a loop four unit chambers of the type shown in FIG. 1. One end (gas supply pipe) of a second discharge chamber $1_2$ is connected to one end (gas discharge pipe) of a first discharge chamber $1_1$. The second discharge chamber $1_2$, a third discharge chamber $1_3$, a fourth discharge chamber $1_4$, and the first discharge chamber $1_1$ are connected in the same manner as described above. The respective unit chambers are provided with induction coils $2_1$ to $2_4$, photosensitive drums $3_1$ to $3_4$, stop valves $5_1$ to $5_4$, gas supply valves $6_1$ to $6_4$ and gas discharge valves $8_1$ to $8_4$.

The operation of the apparatus having the construction described above will be described. The first stop valve $5_1$ is closed, while other stop valves $5_2$, $5_3$ and $5_4$ are opened. In addition, the first gas supply valve $6_1$ and the fourth gas discharge valve $8_4$ are opened, while the second to fourth gas supply valves $6_2$ to $6_4$ and the first to third gas discharge valves $8_1$ to $8_3$ are closed. In this state, the compound gas supplied from the first gas supply valve $6_1$ flows from the first discharge chamber $1_1$ to the fourth discharge chamber $1_4$ through the second and third discharge chambers $1_2$ and $1_3$ and is discharged through the fourth discharge valve $8_4$. This state is illustrated in FIG. 3(A). In the above description, the second to fourth gas supply valves $6_2$ to $6_4$ are closed. However, more preferably, in order to equalize the amounts of compound gas in the first to fourth discharge chambers $1_1$ to $1_4$, the gas supply valves $6_2$, $6_3$ and $6_4$ are slightly opened, and substantially the same amount of the compound gas as an amount dN (where d is the gas consumption ratio and N is an amount of gas supplied from the gas supply valve $6_1$) of the gas consumed in the first discharge chamber $1_1$ is supplied to the second to fourth discharge chambers $1_2$ to $1_4$.

Since the compound gas supplied from the first discharge chamber $1_1$ to the second discharge chamber $1_2$ has been partially decomposed, the gas state in the first discharge chamber $1_1$ differs from that in the second discharge chamber $1_2$. Therefore, the deposition rates and quality of the films deposited on the photosensitive drums $3_1$ and $3_2$ differ from each other. In general, since the second discharge chamber $1_2$ uses the gas which has already been partially decomposed in the first discharge chamber $1_1$, the deposition rate in the second discharge chamber $1_2$ is higher than that in the first discharge chamber $1_1$. This can also be applied to deposition in the third and fourth discharge chambers $1_3$ and $1_4$. In this manner, the deposition rates and the properties of the films deposited in the first to fourth discharge chambers $1_1$ to $1_4$ differ from each other.

Figure 3B:
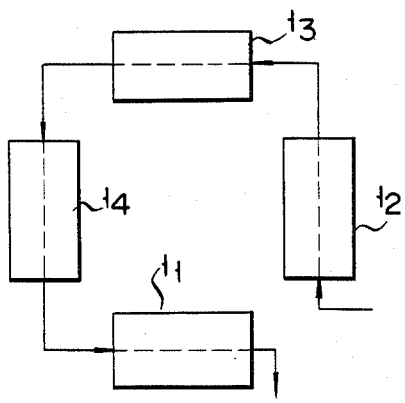

When a predetermined period t has elapsed, the first stop valve $5_1$ is opened, and at the same time the second stop valve $5_2$ is closed. Simultaneously, the first gas supply valve $6_1$ and the fourth gas discharge valve $8_4$ are closed, while the second gas supply valve $6_2$ and the first gas discharge valve $8_1$ are opened. In this state, the compound gas supplied from the second gas supply valve $6_2$ flows in an order of second, third fourth and first discharge chambers and is discharged from the first gas discharge valve $8_1$, as shown in FIG. 3(B). In order to equalize the amounts of gas in the first to fourth discharge chambers $1_1$ to $1_4$, the gas supply valves $6_1$, $6_3$ and $6_4$ are slightly opened, and an amount dN of the compound gas is supplied from these gas supply valves.

When the states shown in FIGS. 3(A) and 3(B) are compared, the state in FIG. 3(B) is the same as a state wherein the first to fourth discharge chambers $1_1$ to $1_4$ are rotated counter clockwise by one unit discharge chamber along the loop. Therefore, the deposition rate and the properties of the thin film formed in the second discharge chamber $1_2$, in the state shown in FIG. 3(B), are the same as those of the film formed in the first discharge chamber $1_1$, in the state shown in FIG. 3(A). Similarly, the deposition rates and properties of the thin films formed in the third, fourth and first discharge chambers $1_3$, $1_4$ and $1_1$, in the state shown in FIG. 3(B), are the same as those of the films formed in the second, third and fourth discharge chambers $1_2$, $1_3$ and $1_4$, respectively, in the state shown in FIG. 3(A).

Figure 3C:
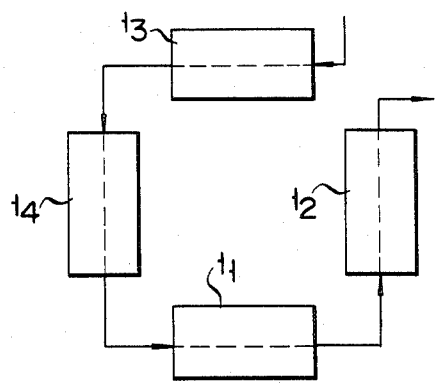
Figure 3D:
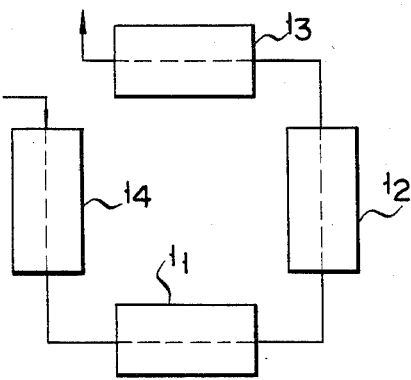

When another predetermined period t has elapsed, the second stop valve $5_2$ is opened and at the same time the third stop valve $5_3$ is closed. Simultaneously, the second gas supply valve $6_2$ and the first gas discharge valve $8_1$ are closed, and the third gas supply valve $6_3$ and the second gas discharge valve $8_2$ are opened. In this state, the compound gas supplied from the third gas supply valve $6_3$ flows in an order of third, fourth, first and second discharge chambers and is discharged from the second gas discharge valve $8_2$, as shown in FIG. 3(C). When still another predetermined period t has elapsed, the third stop valve $5_3$ is opened and at the same time the fourth stop valve $5_4$ is closed. Simultaneously, the third gas supply valve $6_3$ and the second gas discharge valve $8_2$ are closed, and the fourth gas supply valve $6_4$ and the third gas discharge valve $8_3$ are opened. In this state, the compound gas supplied from the fourth gas supply valve $6_4$ flows in an order of fourth, first, second and third discharge chambers $1_4$, $1_1$, $1_2$ and $1_3$ and is discharged from the third gas discharge valve $8_3$. The relationship between the states shown in FIGS. 3(C) and 3(B) is substantially the same as that between the states shown in FIGS. 3(A) and 3(B) and hence that between the states shown in FIGS. 3(C) and 3(D).

Figure 4:
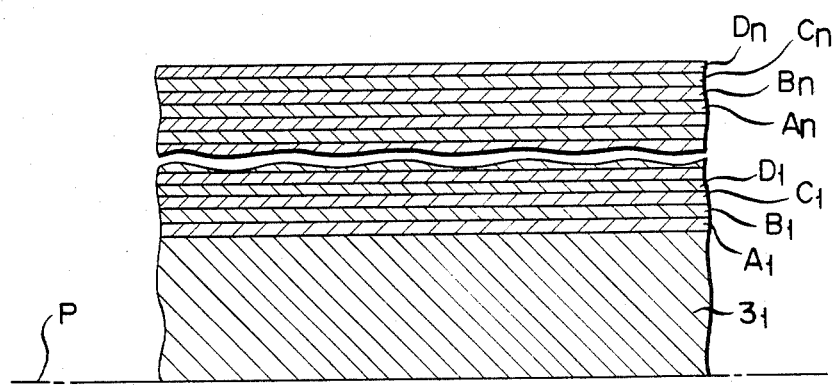
FIG. 4 is a sectional view showing a multilayer structure of the thin film obtained according to the present invention.

The operation in sequence of the four states in FIGS. 3(A) to 3(D) is defined as a cycle. Repeated cycles are performed until the thickness of each thin film reaches a predetermined value. The thin film thus obtained comprises a plurality of four-layer films, which correspond to the number of cycles, each including the states shown in FIGS. 3(A) to 3(D). For example, as shown in FIG. 4, the film formed on the first drum $3_1$ in the first discharge chamber $1_1$ comprises a plurality of four-layer films corresponding to n cycles. Each four-layer film comprises four layers A1, B1, C1 and D1 respectively formed in the states shown in FIGS. 3(A), 3(B), 3(C) and 3(D). Similarly n×four-layer films are formed on the second drum $3_2$ in the second discharge chamber $1_2$. Each four-layer film comprises four layers in an order of B1, C1, D1 and A1. Similarly, n×four-layer films are formed on the third drum $3_3$ in the third discharge chamber $1_3$, and each four-layer film comprises four layers in an order of C1, D1, A1 and B1. Similarly, n×four-layer films are formed on the fourth drum $3_4$ in the fourth discharge chamber $1_4$, and each four-layer film comprises four layers in an order of D1, A1, B1 and C1. In this manner, the films such as a-Si films on the first to fourth drums $3_1$ to $3_4$ are formed in different orders. However, these films have the same total thickness and can be regarded as being uniform as a whole. In addition, when the cycle time is shortened to increase the number of cycles, the uniformity of the thin films on the drums $3_1$ to $3_4$ can be increased.

According to the apparatus of the first embodiment, the four unit chambers are connected in a loop, and the stop valves $5_1$ to $5_4$, the gas supply valves $6_1$ to $6_4$ and the gas discharge valves $8_1$ to $8_4$ are controlled in the manner as described above, so that uniform thin films can be simultaneously formed on the drums $3_1$ to $3_4$, respectively. Unlike the case of completely separate unit chambers, the amount of compound gas consumed can be decreased to substantially $\frac{1}{4}$. For this reason, the gas utilization efficiency is increased to four times the conventional efficiency, thereby decreasing the manufacturing cost. The amount dN of gas supplied to three gas supply valves is smaller than the main gas amount N supplied from the remaining gas supply valve, since the gas combination ratio d is small and less than 0.1.

In the above embodiment, when one of the gas discharge valves is opened, the remaining gas discharge valves are closed. However, when a larger number of unit chambers are used, some of the gas discharge valves, which are supposed to be closed, can be partially opened. In this case, the amount of gas consumed cannot be decreased to an exact fraction corresponding to the number of unit chambers used. However, this amount is smaller than that consumed in the case wherein the unit chambers are separately operated. The stop valves $5_1$ to $5_4$, the gas supply valves $6_1$ to $6_4$ and the gas discharge valves $8_1$ to $8_4$ can be such that the quality of film formed in each unit chamber becomes uniform even when the shapes of the respective unit chambers are not uniform. The opening/closing and flow rate of the valves can be easily controlled by a microcomputer. The flow rate of the gas may be changed during a single cycle under the control of the microcomputer, thereby forming a thin film of better quality. In addition, an optical or electrical monitor may be arranged in each unit chamber, and the data from the monitor can be fed back to control the opening/closing and flow rate of the corresponding valve.

Figure 5:
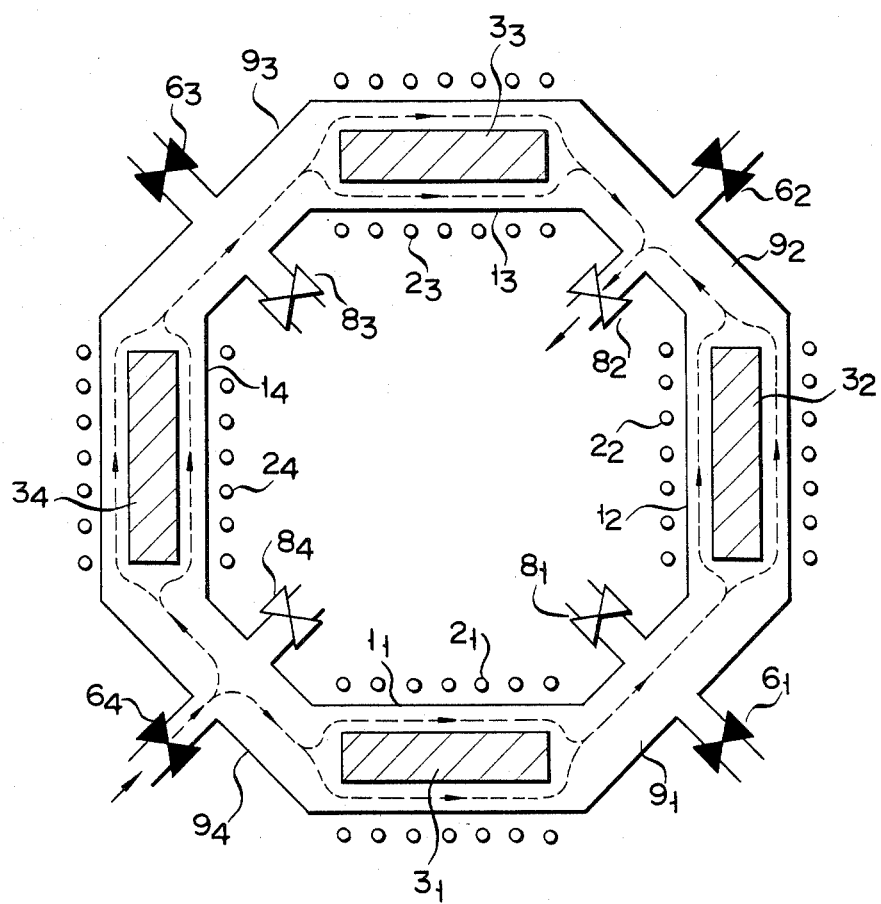
FIG. 5 is a schematic view showing a thin film forming apparatus according to a second embodiment of the present invention.

FIG. 5 shows a thin film forming apparatus according to a second embodiment of the present invention. The same reference numerals as used in FIG. 5 denote the same parts in FIGS. 1 and 2, and a detailed description thereof will be omitted. The gas flow path of the second embodiment is different from that of the first embodiment. In the second embodiment, as shown in FIG. 5, the apparatus comprises: discharge chambers $1_1$ to $1_4$; induction coils $2_1$ to $2_4$ wound around the discharge chambers $1_1$ to $1_4$, respectively; connecting pipes $9_1$ to $9_4$ for connecting the discharge chambers $1_1$ to $1_4$ in a loop; gas supply valves $6_1$ to $6_4$; and gas discharge valves $8_1$ to $8_4$. In this construction, the stop valves 5 are not used.

In the apparatus having the construction described above, the fourth gas supply valve $6_4$ and the second gas discharge valve $8_2$ opposing it are opened, while the first to third gas supply valves $6_1$ to $6_3$ and the first, third and fourth gas discharge valves $8_1$, $8_3$ and $8_4$ are closed. In this state, the compound gas supplied from the fourth gas supply valve $6_4$ flows as separate gas flows into the first and second discharge chambers $1_1$ and $1_2$ and into the fourth and third discharge chambers $1_4$ and $1_3$, and these separate gas flows are simultaneously discharged from the second discharge valve $8_2$. Subsequently, every time a predetermined period t has elapsed, the valve to be opened is switched along one direction of the loop. For example, the gas discharge valves are opened in an order of $8_4$, $8_1$, $8_2$ and $8_3$, and the gas supply valves are opened in an order of $6_2$, $6_3$, $6_4$ and $6_1$. The above operation is defined as a cycle. This cycle is repeated until the thickness of the thin film reaches a predetermined value. The thin film such as an a-Si film comprises a plurality of four-layer films, each of which comprises a different four layers.

In the same manner as in the first embodiment, the uniform thin films such as a-Si films are simultaneously formed on the drums $3_1$ to $3_4$ in the discharge chambers $1_1$ to $1_4$. In this case, the amount of compound gas consumed can be decreased to substantially $\frac{1}{2}$ that of the conventional case.

FIG. 6 shows a thin film forming apparatus according to a third embodiment of the present invention. The same reference numerals as used in FIG. 1 denote the same parts in FIG. 6, and a detailed description thereof will be omitted. The construction of the unit chamber of this apparatus embodiment is different from that of the first embodiment. The unit chamber of the third embodiment is a capacitive coupling-type chamber wherein upper and lower electrodes 11 and 12 are disposed parallel to each other. The upper electrode 11 is grounded, and an RF power supply 13 is connected between the upper and lower electrodes 11 and 12. A substrate 14 as a sample is mounted on the surface of the upper electrode 11. The substrate 14 is used as a flat substrate for a one-dimensional image sensor or an image sensor device. The upper electrode 11 is heated by a heater (not shown) and is rotated about an axis P. On the other hand, apertures are formed in the upper surface of the lower electrode 12. A compound gas from a gas supply pipe 4 is supplied to a discharge chamber 1 through these apertures. Furthermore, the compound gas in the discharge chamber 1 is discharged to a gas discharge pipe 7 through small tubes 16 connected to the upper wall of the discharge chamber 1. Reference numeral 15 denotes an insulating cylinder for insulating the gas supply pipe 4 from the lower electrode 12. A stop valve 5, a gas supply valve 6, and a gas discharge valve 8 are mounted at the same positions as in the first embodiment.

The apparatus of this embodiment is obtained by connecting four unit chambers having the above-mentioned construction in a loop in the same manner as in the first embodiment. The positional relationships among discharge chambers $1_1$ to $1_4$ and various valves $5_1$ to $5_4$, $6_1$ to $6_4$, and $8_1$ to $8_4$ are the same as those in the first embodiment, except for the glow discharge generating means. Reference numerals $11_1$ to $11_4$ in FIG. 6 denote upper electrodes in the discharge chambers $1_1$ to $1_4$, respectively. Therefore, the valves can be controlled in the same manner as in the first embodiment to obtain the same effect as in the first embodiment.

Figure 8:
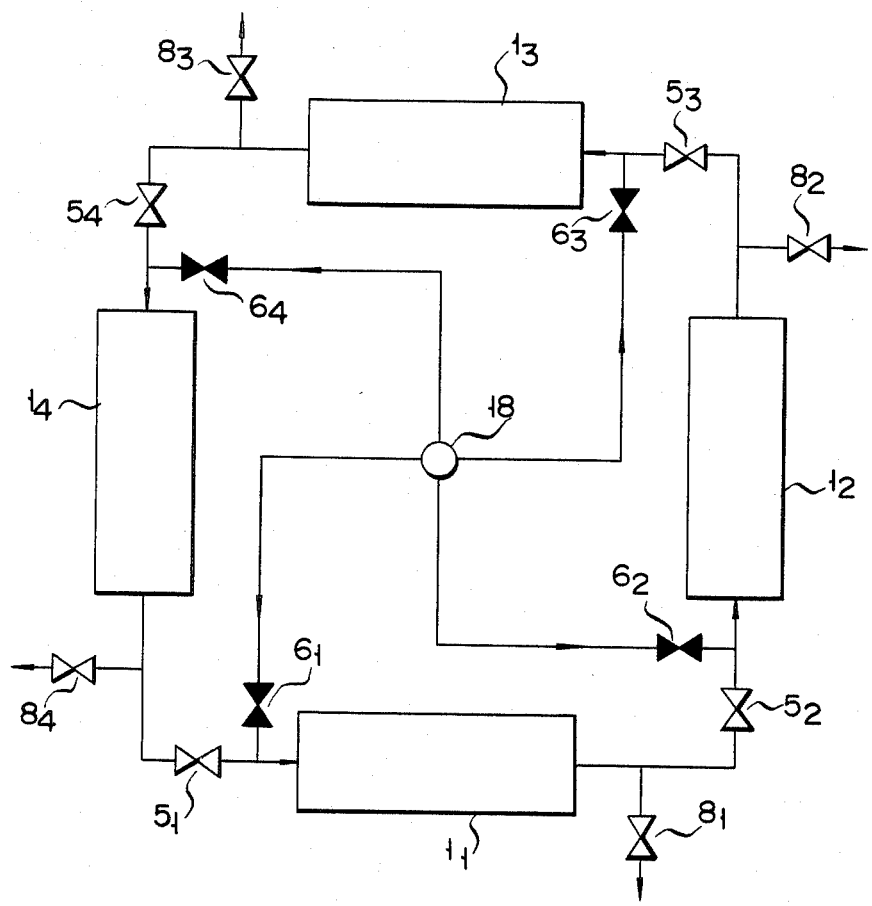
FIG. 8 is a schematic view showing a thin film forming apparatus according to a fourth embodiment of the present invention.
Figure 9:
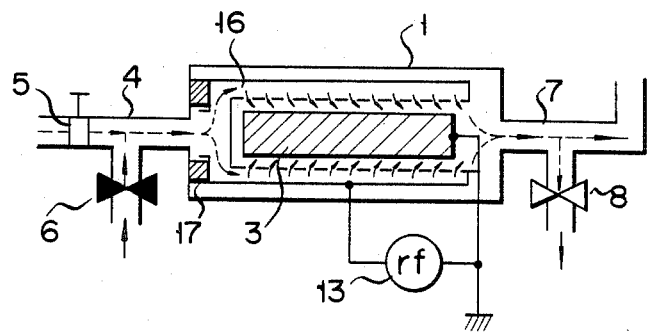
FIG. 9 is a detailed view showing a unit chamber of the apparatus shown in FIG. 8.

FIG. 8 shows a thin film forming apparatus according to a fourth embodiment of the present invention. The same reference numerals are used in FIG. 8 to denote the same parts as in FIGS. 1 and 2, and a detailed description thereof will be omitted. The unit chamber of the fourth embodiment differs from that of the first embodiment. The unit chamber comprises a capacitive coupling type chamber 1 wherein a hollow electrode 16 is disposed, as shown in FIG. 9. An RF power supply 13 is connected between the hollow electrode 16 and a drum 3. A plurality of apertures are formed in the inner surface of the hollow electrode 16. A compound gas from a gas supply pipe 4 is supplied to the discharge chamber 1 through these apertures. Reference numeral 17 denotes an insulating cylinder for insulating the hollow electrode 16 and the discharge chamber 1. The positions of a stop valve 5, a gas supply valve 6 and a gas discharge valve 8 are the same as those in the first embodiment.

The apparatus of the fourth embodiment is constituted by connecting in a loop four unit chambers, in the same manner as in the first embodiment described above. The positional relationships among the discharge chambers $1_1$ to $1_4$, the stop valves $5_1$ to $5_4$, the gas supply valves $6_1$ to $6_4$ and the gas discharge valves $8_1$ to $8_4$ are the same as those in the first embodiment. The compound gas for forming the thin film is supplied from a common gas supply pipe 18 to the gas supply valves $6_1$ to $6_4$. Therefore, the valves can be opened/closed in the same manner as in the first embodiment to obtain the same effect as in the first embodiment.

Figure 10:
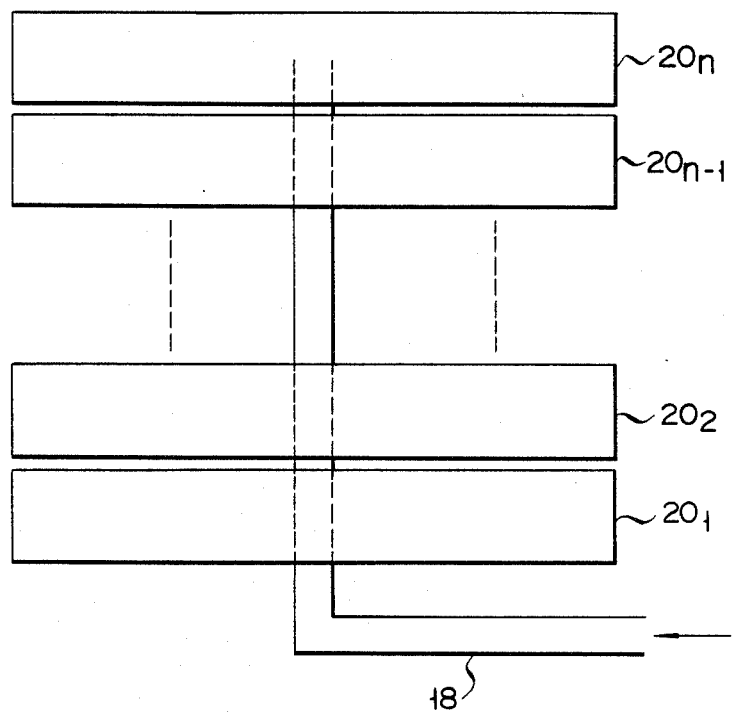
FIG. 10 is a representation showing a structure obtained by stacking a plurality of the apparatuses shown in FIG. 8.

FIG. 10 shows a structure wherein n apparatuses of the fourth embodiment are stacked. More specifically, n apparatuses each comprising a loop of four unit chambers are vertically stacked. A common gas supply pipe 18 is connected to the respective gas supply valves of the first to nth apparatuses $20_1$, $20_2$, ..., and $20_n$. The same effect as in the first embodiment can be obtained in the above structure.

The present invention is not limited to the particular embodiments described above. For example, the number of unit chambers is not limited to 4. It is essential to arrange the apparatus with a plurality of unit chambers. The construction of the unit chamber may be modified as needed. Thus, the unit chambers having the same construction and the same function, decomposing the compound gas by discharge to deposit thin films on corresponding samples, are connected in a loop. In addition to these modifications, the compound gas is not limited to $SiH_4$ or the like. The compound gas can be arbitrarily selected in accordance with the type of thin film to be deposited on the sample. The switching time t of the respective valves and the gas amount N may be determined in accordance with a given specification. In addition, the gas discharged from the last unit chamber may be reused for thin film formation.

Other changes and modifications may be made within the spirit and scope of the present invention.

EXAMPLE

A thin amorphous silicon film was formed by the apparatus of FIG. 2.

Only the gas supply valve $6_1$ and the gas discharge valve $8_4$ were opened, and a gas mixture ($SiH_4:H_2:O_2=100:99:1$) of $SiH_4$, $H_2$ and $O_2$ was supplied from the gas supply valve $6_1$ at a flow rate of 200 SCCM. The gas mixture was flowed through the discharge chambers in an order of $1_1$, $1_2$, $1_3$ and $1_4$, and was discharged from the gas discharge valve $8_4$. Meanwhile, the corresponding drum 3 was rotated at a speed of 10 rpm, and a high frequency of 13.56 MHz (100 W) was applied to the corresponding induction coil 2 to generate glow discharge. The gas supply valves and the gas discharge valves were selectively opened in an order shown in FIGS. 3(A), 3(B), 3(C), 3(D) and 3(A) with a time cycle of one minute. An amorphous Si layer was deposited on the corresponding drum 3. As a result, the amorphous silicon film reached a thickness of 15 μm in 120 minutes.

In order to equalize the amounts of gas in the discharge chambers $1_1$ to $1_4$, other gas supply valves, excluding the gas supply valve currently used for mainly supplying the gas mixture, were opened to receive the gas mixture ($SiH_4:H_2:O_2=100:99:1$:) at a flow rate of 20 SCCM. An amorphous silicon film was deposited under the above conditions. The resultant amorphous silicon film reached a thickness of 20 μm in 120 minutes.

What is claimed is:

1. An apparatus for forming a thin film on a substrate by the decomposition of a compound gas, containing a target thin film component, by means of glow discharge, which further comprises:
    a main body having a plurality of discharge unit chambers, each provided with a glow discharge generating means and a space for housing the substrate and connected in a loop via chamber-connecting portions, sets of gas supply valves and gas discharge valves being connected to the chamber-connecting portions; and
    means for sequentially switching on and off said gas supply valves and said gas discharge valves every time a predetermined period of time has elapsed.

2. An apparatus, according to claim 1, which further comprises stop valves between said gas supply valves and said gas discharge valves.

3. An apparatus according to claim 1, wherein said glow discharge generating means comprises capacitive coupling-type glow discharge generating means.

4. An apparatus according to claim 1, wherein said unit chambers number four.

5. An apparatus according to claim 1, wherein a plurality of sets of looped unit chambers are prepared, and the compound gas is supplied to said plurality of sets of looped unit chambers through a common gas supply pipe.

6. An apparatus for forming a thin film on a substrate by the decomposition of a compound gas, containing a thin film component, by means of glow discharge, characterized by comprising:

a plurality of discharge unit chambers, each provided with a glow discharge generating means and a space for housing the substrate and connected in a loop via chamber-connecting means, gas supply valves and gas discharge valves being connected to the chamber-connecting means; and means for sequentially switching on and off gas supply valves and said gas discharge valves one after another at a predetermined time cycle such that said compound gas flows in a predetermined direction.

* * * * *